United States Patent [19]

Otsu

[11] Patent Number: 5,083,178
[45] Date of Patent: Jan. 21, 1992

[54] SEMICONDUCTOR CMOS GATE ARRAY

[75] Inventor: Takaji Otsu, Kanagawa, Japan

[73] Assignee: Sony Corporation, Tokyo, Japan

[21] Appl. No.: 571,772

[22] Filed: Aug. 24, 1990

[30] Foreign Application Priority Data

Aug. 25, 1989 [JP] Japan .................. 1-219970

[51] Int. Cl.$^5$ ............................................ H01L 27/02
[52] U.S. Cl. ...................................... 357/40; 357/45; 357/41
[58] Field of Search ................ 357/41, 23.5, 42, 40, 357/46, 45, 59 G, 45 M, 45 R

[56] References Cited

U.S. PATENT DOCUMENTS

| | | | |
|---|---|---|---|
| 4,688,072 | 8/1987 | Heath et al. | 357/45 |
| 4,764,798 | 8/1988 | Kawabata | 357/45 |
| 4,783,692 | 11/1988 | Uratani | 357/45 |
| 4,982,114 | 1/1991 | Nakamura et al. | 357/45 X |

FOREIGN PATENT DOCUMENTS

| | | |
|---|---|---|
| 0131463 | 1/1985 | European Pat. Off. . |
| 59-150446 | 8/1984 | Japan . |
| 60-177651 | 9/1985 | Japan .................. 357/45 M |
| 61-268040 | 11/1986 | Japan . |
| 61-268040 | 11/1986 | Japan . |

*Primary Examiner*—William Mintel
*Attorney, Agent, or Firm*—Hill, Van Santen, Steadman & Simpson

[57] ABSTRACT

A semiconductor device of a master slice type comprises a basic cell comprising: first and second MOS transistors of a first conductivity type in each of which one of a source region and a drain region is commonly used; third and fourth MOS transistors of the first conductivity type in each of which one of a source region and a drain region is commonly used; fifth and sixth MOS transistors of a second conductivity type in each of which one of a source region and a drain region is commonly used; and seventh and eighth MOS transistors of the second conductivity type in each of which one of a source region and a drain region is commonly used. Gate electrodes of the first and third MOS transistors are commonly used, gate electrodes of the second and fourth MOS transistors are commonly used, and gate electrodes of the fifth and seventh MOS transistors are commonly used.

7 Claims, 6 Drawing Sheets

SEMICONDUCTOR CMOS GATE ARRAY

BACKGROUND OF THE INVENTION

1. Field of the Invention

The present invention relates to a semiconductor device of a master slice type.

2. Description of the Prior Art

Figure 1:
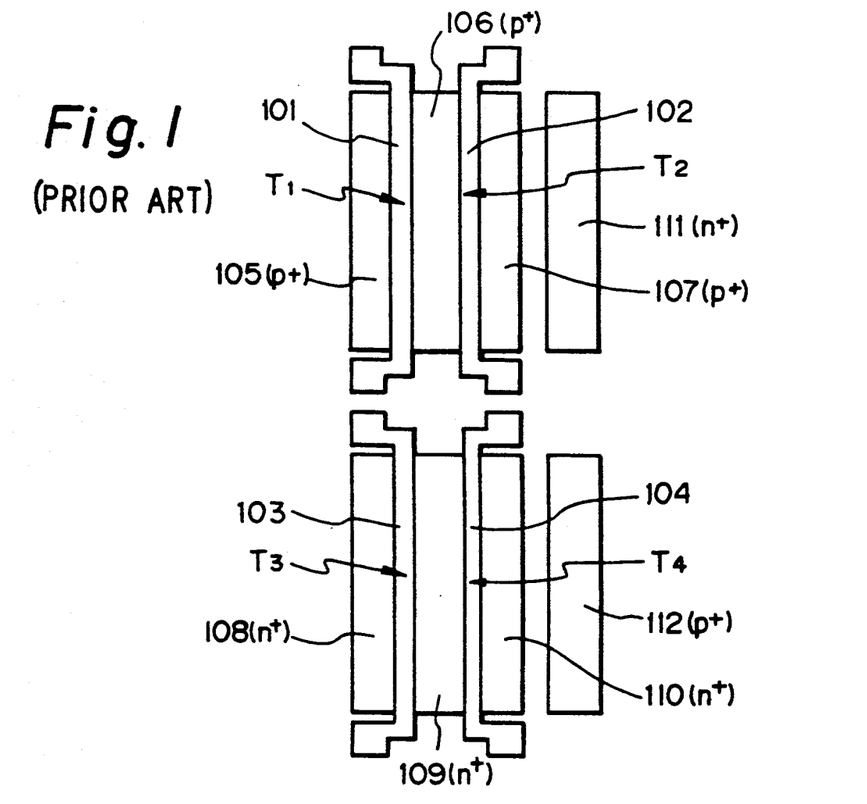
FIG. 1 is a plan view showing a basic cell which is used in a conventional CMOS gate array.

A gate array is known as a semiconductor device of the master slice type. A CMOS gate array is known as one kind of such gate arrays. FIG. 1 shows an example of a basic cell of a conventional CMOS gate array. As shown in FIG. 1, a basic cell of the conventional CMOS gate array comprises two p-channel MOS transistors $T_1$ and $T_2$ and two n-channel MOS transistors $T_3$ and $T_4$. Values of W/L (W: channel width, L: channel length) of the p-channel MOS transistors $T_1$ and $T_2$ are equal. Values of W/L of the n-channel MOS transistors $T_3$ and $T_4$ are also the same. Reference numerals 101 to 104 denote gate electrodes. Reference numerals 105 to 107 indicate p+-type semiconductor regions which are used as source regions or drain regions of the p-channel MOS transistors $T_1$ and $T_2$. The semiconductor regions 105 to 107 are formed in, for example, an n-well formed in a semiconductor substrate (not shown). On the other hand, reference numerals 108 to 110 indicate, for instance, n+-type semiconductor regions which are used as source regions or drain regions of the n-channel MOS transistors $T_3$ and $T_4$. The semiconductor regions 108 to 110 are formed in, for example, a p-well formed in the semiconductor substrate (not shown). In this case, the p-channel MOS transistor $T_1$ is formed by the gate electrode 101 and the semiconductor regions 105 and 106. The p-channel MOS transistor $T_2$ is formed by the gate electrode 102 and the semiconductor regions 106 and 107. Similarly, the n-channel MOS transistor $T_3$ is formed by the gate electrode 103 and the semiconductor regions 108 and 109. The n-channel MOS transistor $T_4$ is formed by the gate electrode 104 and the semiconductor regions 109 and 110. Reference numeral 111 denotes, for instance, an n+-type semiconductor region which is used to make a wiring to supply a power source voltage $V_{DD}$ contact the n-well. Reference numeral 112 indicates, for instance, a p+-type semiconductor region which is used to make a wiring to supply a power source voltage $V_{SS}$ contact the p-well.

There are the following problems in the case of constructing, for instance, a full CMOS type static RAM by the conventional CMOS gate array comprising the basic cell shown in FIG. 1 mentioned above. That is, memory cells of the full CMOS type static RAM are ordinarily constructed by four n-channel MOS transistors and two p-channel MOS transistors. Therefore, in the case of constructing the memory cells of the full CMOS type static RAM by using the basic cells shown in FIG. 1, two such basic cells are needed. In this case, two p-channel MOS transistors remain. That is, in the case of constructing the memory cells of the full CMOS type static RAM by using the basic cells shown in FIG. 1, the half of one basic cell is not used and the use efficiency of the basic cell is low. Thus, it is difficult to improve the integration density of the memory cells.

On the other hand, in the case of constructing a 2-input NAND circuit, a 2-input NOR circuit, an inverter circuit, a transmission circuit, or the like by using the basic cell shown in FIG. 1, the optimum circuit construction cannot be easily obtained due to reasons such that a degree of freedom of wirings among the transistors is small and the like.

OBJECTS AND SUMMARY OF THE INVENTION

It is, therefore, an object of the invention to provide a semiconductor device of the master slice type in which in the case of constructing a full CMOS type static RAM, a high integration density of memory cells can be realized.

Another object of the invention is to provide a semiconductor device of the master slice type in which in the case of constructing a NAND circuit, a NOR circuit, or the like, a circuit construction near the optimum construction can be realized.

According to an aspect of the invention, there is provided a semiconductor device of a master slice type, comprising a basic cell comprising: first and second MOS transistors of a first conductivity type in each of which one of a source region and a drain region is commonly used; third and fourth MOS transistors of the first conductivity type in each of which one of a source region and a drain region is commonly used; fifth and sixth MOS transistors of a second conductivity type in each of which one of a source region and a drain region is commonly used; and seventh and eighth MOS transistors of the second conductivity type in each of which one of a source region and a drain region is commonly used, gate electrodes of the first and third MOS transistors being commonly used, gate electrodes of the second and fourth MOS transistors being commonly used, and gate electrodes of the fifth and seventh MOS transistors being commonly used.

According to the invention, the basic cell is constructed by four MOS transistors of the first conductivity type and four MOS transistors of the second conductivity type. Therefore, a memory cell of a full CMOS type static RAM comprising two p-channel MOS transistors and four n-channel MOS transistors can be constructed by such a basic cell. In this case, although two p-channel MOS transistors in the basic cell remain, those two p-channel MOS transistors merely occupy about ¼ of the basic cell. Therefore, the use efficiency of the basic cell is higher as compared with the case of constructing the memory cell of the full CMOS type static RAM by using the conventional basic cell shown in FIG. 1. Thus, the high integration density of the memory cell can be realized. Further, as compared with the conventional basic cell shown in FIG. 1, the degree of freedom of the wirings among the transistors is larger. Therefore, in the case of constructing a NAND circuit, a NOR circuit, or the like, a circuit construction near the optimum construction can be realized.

The above, and other, objects, features and advantages of the present invention will become readily apparent from the following detailed description thereof which is to be read in connection with the drawings.

DESCRIPTION OF THE PREFERRED EMBODIMENTS

Embodiments of the present invention will be described hereinbelow with reference to the drawings. All of the following embodiments are embodiments in the case of using a CMOS gate array of the sea of gates type. In all of the drawings of the embodiments, the same portions are designated by the same reference numerals.

Figure 2:
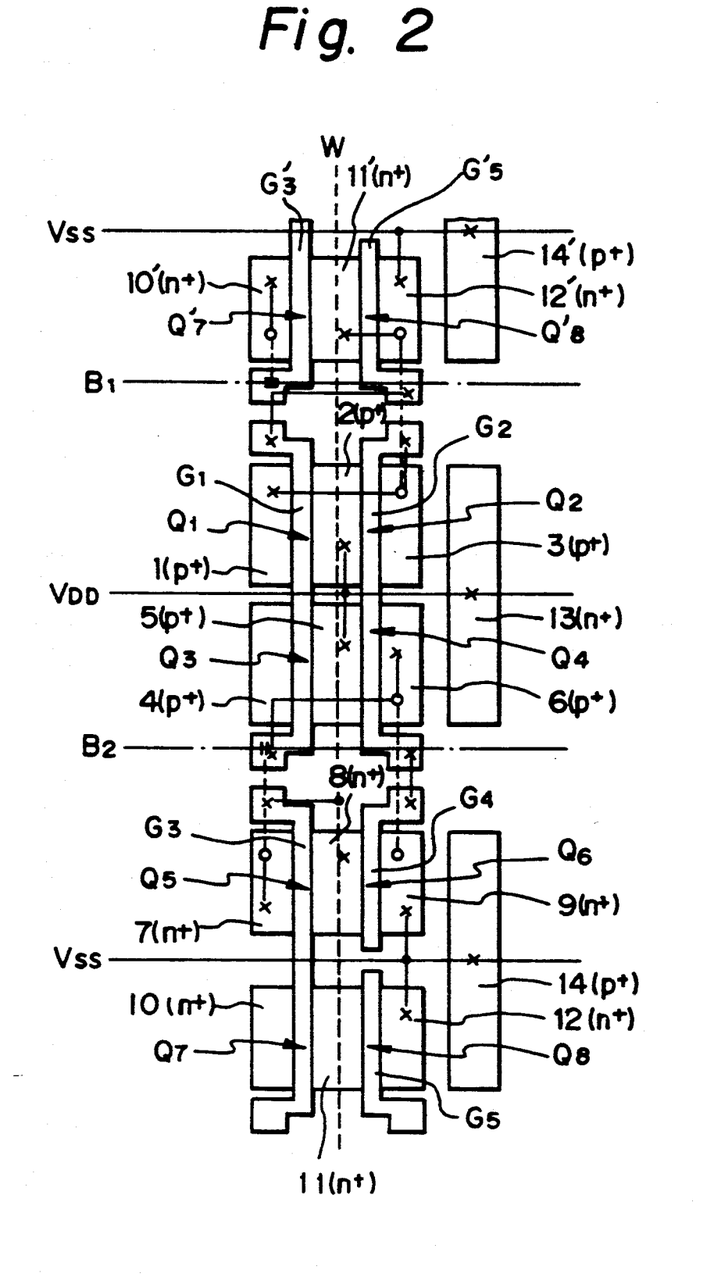
FIG. 2 is a plan view showing an embodiment in which the invention was applied to a full CMOS type static RAM.
Figure 3:
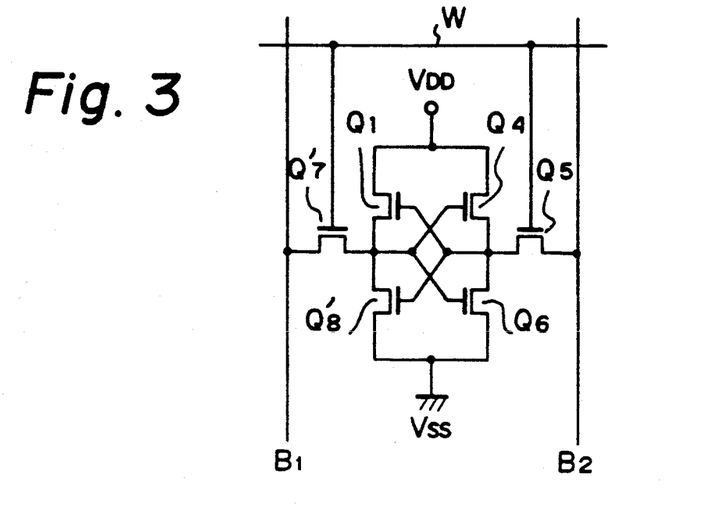
FIG. 3 is a circuit diagram showing an equivalent circuit of a memory cell of the full CMOS type static RAM shown in FIG. 2.
Figure 4:
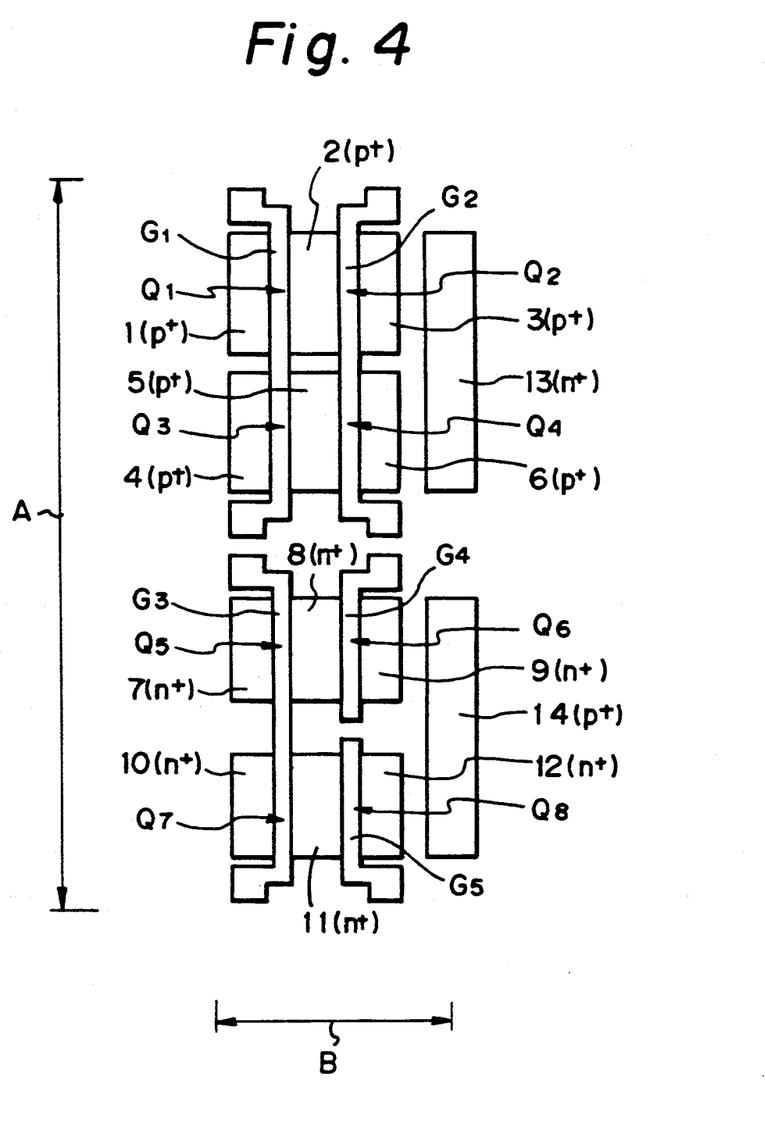
FIG. 4 is a plan view showing a basic cell which is used in the embodiment of the invention.

FIG. 2 shows an embodiment of the invention. This embodiment is an embodiment in which a full CMOS type static RAM is constructed by a CMOS gate array of the sea of gates type. FIG. 3 shows an equivalent circuit of a memory cell of the full CMOS type static RAM shown in FIG. 2. FIG. 4 shows a basic cell of the sea of gates type CMOS gate array which is used in the embodiment.

First, a construction of the basic cell of the sea of gates type CMOS gate array which is used in the embodiment will be described. As shown in FIG. 4, the basic cell which is used in the embodiment comprises four p-channel MOS transistors $Q_1$ to $Q_4$ and four n-channel MOS transistors $Q_5$ to $Q_8$. Values of W/L (W: channel width, L: channel length) of the p-channel MOS transistors $Q_1$ to $Q_4$ are equal. Values of W/L of the n-channel MOS transistors $Q_5$ to $Q_6$ are also equal. Reference characters $G_1$ to $G_5$ denote gate electrodes. In this case, the gate electrode $G_1$ is commonly used between the p-channel MOS transistors $Q_1$ and $Q_3$. The gate electrode $G_2$ is commonly used between the p-channel MOS transistors $Q_2$ and $Q_4$. The gate electrode $G_3$ is commonly used between the n-channel MOS transistors $Q_5$ and $Q_7$. On the other hand, the gate electrodes $G_4$ and $G_5$ for the n-channel MOS transistors $Q_6$ and $Q_8$ are separated from each other. Each of the gate electrodes $G_1$ to $G_5$ can be formed by, for instance, an $n^+$-type polycrystalline silicon (Si) film in which an impurity such as phosphorus (P) was doped or a polycide film in which a refractory metal silicide film such as a tungsten silicide ($WSi_2$) film was laid on the $n^+$-type polycrystalline Si film.

Reference numerals 1 to 6 denote, for instance, $p^+$-type semiconductor regions which are used as source regions or drain regions of the p-channel MOS transistors $Q_1$ to $Q_4$. The semiconductor regions 1 to 6 are formed in, for example, an n-well formed in a semiconductor substrate (not shown). Reference numerals 7 to 12 denote, for instance, $n^+$-type semiconductor regions which are used as source regions or drain regions of the n-channel MOS transistors $Q_5$ to $Q_8$. The semiconductor regions 7 to 12 are formed in, for example, a p-well formed in the semiconductor substrate (not shown). Reference numeral 13 denotes, for instance, an $n^+$-type semiconductor region which is used to make a connection to connect the power source voltage $V_{DD}$ within the n-well. Reference numeral 14 indicates, for instance, a $p^+$-type semiconductor region which is used to make a connection to connect the power source voltage $V_{SS}$ with the p-well.

In the embodiment, the p-channel MOS transistor $Q_1$ is formed by the gate electrode $G_1$ and the semiconductor regions 1 and 2. The p-channel MOS transistor $Q_2$ is formed by the gate electrode $G_2$ and the semiconductor regions 2 and 3. The semiconductor region 2 is commonly used between the p-channel MOS transistors $Q_1$ and $Q_2$. On the other hand, the p-channel MOS transistor $Q_3$ is formed by the gate electrode $G_1$ and the semiconductor regions 4 and 5. The p-channel MOS transistor $Q_4$ is formed by the gate electrode $G_2$ and the semiconductor regions 5 and 6. The semiconductor region 5 is commonly used between the p-channel MOS transistors $Q_3$ and $Q_4$. On the other hand, the n-channel MOS transistor $Q_5$ is formed by the gate electrode $G_3$ and the semiconductor regions 7 and 8. The n-channel MOS transistor $Q_6$ is formed by the gate electrode $G_4$ and the semiconductor regions 8 and 9. The semiconductor region 8 is commonly used between the n-channel MOS transistors $Q_5$ and $Q_6$. The n-channel MOS transistor $Q_7$ is formed by the gate electrode $G_3$ and the semiconductor regions 10 and 11. The n-channel MOS transistor $Q_8$ is formed by the gate electrode $G_5$ and the semiconductor regions 11 and 12. The semiconductor region 11 is commonly used between the p-channel MOS transistors $Q_7$ and $Q_8$.

An example of the dimensions of the basic cell shown in FIG. 4 is as follows. For instance, when a design rule is set to 0.7 $\mu m$, assuming that a length of one unit on design is set to 1G (grid), dimensions A and B (FIG. 4) of the basic cell can be set to 14G and 3.5G, respectively. For instance, assuming that 1G= 2.1 $\mu m$, $A = 14 \times 2.1 = 29.4$ $\mu m$ and $B = 3.5 \times 2.1 = 7.35$ $\mu m$. On the other hand, W/L of the p-channel MOS transistors $Q_1$ to $Q_4$ are such that $W/L = 4.9$ $\mu m/0.8$ $\mu m$. W/L of the n-channel MOS transistors $Q_5$ to $Q_8$ are such that $W/L = 4.2$ $\mu m/0.7$ $\mu m$. The values of W/L of the p-channel MOS transistors $Q_1$ to $Q_4$ and the n-channel MOS transistors $Q_5$ to $Q_8$ are almost equal. In this case, a performance ratio of the p-channel MOS transistors $Q_1$ to $Q_4$ to the n-channel MOS transistors $Q_5$ to $Q_8$ is proportional to a ratio of the hole mobility to the electron mobility.

Explanation will now be made with respect to an embodiment in which a full CMOS type static RAM is constructed by the sea of gate type CMOS gate array comprising the basic cell shown in FIG. 4.

As shown in FIGS. 2 and 3, in the embodiment, a flip-flop circuit of the memory cell of the full CMOS type static RAM is constructed by the p-channel MOS transistors $Q_1$ and $Q_4$ and the n-channel MOS transistors $Q_8'$ and $Q_6$. Here, the n-channel MOS transistor $Q_8'$ corresponds to the n-channel MOS transistor $Q_8$ among the MOS transistors constructing the basic cell adjacent to the basic cell comprising the p-channel MOS transistors $Q_1$ to $Q_4$ and the n-channel MOS transistors $Q_5$ to $Q_8$. One of CMOS inverters constructing the flip-flop circuit is constructed by the p-channel MOS transistor $Q_1$ and the n-channel MOS transistor $Q_8'$. The other CMOS inverter is constructed by the p-channel MOS transistor $Q_4$ and the n-channel MOS transistor $Q_6$. In this case, the p-channel MOS transistors $Q_1$ and $Q_4$ are used as load transistors. The n-channel MOS transistors $Q_8'$ and $Q_6$ are used as driver transistors. On the other hand, the n-channel MOS transistors $Q_7'$ and $Q_5$ are used as access transistors. The n-channel MOS transistor $Q_7'$ corresponds to the n-channel MOS transistor $Q_7$ among the MOS transistors constructing the basic cell adjacent to the basic cell comprising the p-channel MOS transistors $Q_1$ to $Q_4$ and the n-channel MOS transistors $Q_5$ to $Q_8$. On the other hand, W denotes a word line and $B_1$ and $B_2$ indicate bit lines.

In the embodiment, the wiring is executed by using aluminum (Al) wirings of three layers. In FIG. 2, X denotes a contact portion of the Al wiring of the first layer and the $p^+$-type or $n^+$-type semiconductor region or gate electrode, ○ indicates a contact portion of the Al wiring of the second layer and the Al wiring of the first layer, and □ represents a contact portion of the Al wiring of the third layer and the Al wiring of the second layer. In FIG. 2, the Al wirings of the first, second, and third layers passing through the contact portions are shown by a solid line (—), a broken line (— — —) and an alternate long and short dash line (----) respectively. In this case, the wirings to supply the power source voltage $V_{DD}$ and $V_{SS}$ are constructed by the Al wiring of the first layer. The Al wiring of the first layer to supply the power source voltage $V_{DD}$ is come into contact with the semiconductor regions 2, 5, and 13. On the other hand, the Al wiring of the first layer to supply the power source voltage $V_{SS}$ is come into contact with the semiconductor regions 9, 12, and 14. Further, the Al wiring of the first layer to supply the power source voltage $V_{SS}$ for the basic cell adjacent to the basic cell comprising the p-channel MOS transistors $Q_1$ to $Q_4$ and the n-channel MOS transistors $Q_5$ to $Q_8$ is come into contact with semiconductor regions 12' and 14'. On the other hand, a word line W is constructed by the Al wiring of the second layer. The bit lines $B_1$ and $B_2$ are constructed by the Al wirings of the third layer. The bit line $B_1$ constructed by the Al wiring of the third layer is come into contact with a semiconductor region 10' through the Al wiring of the second layer and the Al wiring of the first layer. Similarly, the bit line $B_2$ constructed by the Al wiring of the third layer comes into contact with the semiconductor region 7 through the Al wiring of the second layer and the Al wiring of the first layer.

As mentioned above, according to the embodiment, the full CMOS type static RAM is constructed by the CMOS gate array comprising the basic cell shown in FIG. 4. Therefore, the memory cell of the full CMOS type static RAM can be substantially constructed by one basic cell shown in FIG. 4, though the memory cell extends over the two adjacent basic cells. In this case, although two p-channel MOS transistors in the basic cell are not used but remain, those unused p-channel MOS transistors merely occupy about ¼ of the basic cell. Therefore, the use efficiency of the basic cell is higher than the case of constructing the memory cell of the full CMOS type static RAM by using the basic cell shown in FIG. 1. Thus, the full CMOS type static RAM in which the integration density of the memory cells is higher as compared with the conventional one can be easily realized by the CMOS gate array.

In the embodiment, the wiring has been performed by using the Al wirings of three layers as mentioned above. However, for instance, if each channel width of the p-channel MOS transistors $Q_1$ to $Q_4$ and the n-channel MOS transistors $Q_5$ to $Q_8$ is increased by 1G, the bit lines $B_1$ and $B_2$ can be formed by the Al wiring of the first layer. Therefore, the Al wiring of the third layer is unnecessary. In this case, the wiring can be executed by the Al wirings of two layers.

An embodiment in which the invention was applied to a 2-input NAND circuit will now be described.

Figure 5:
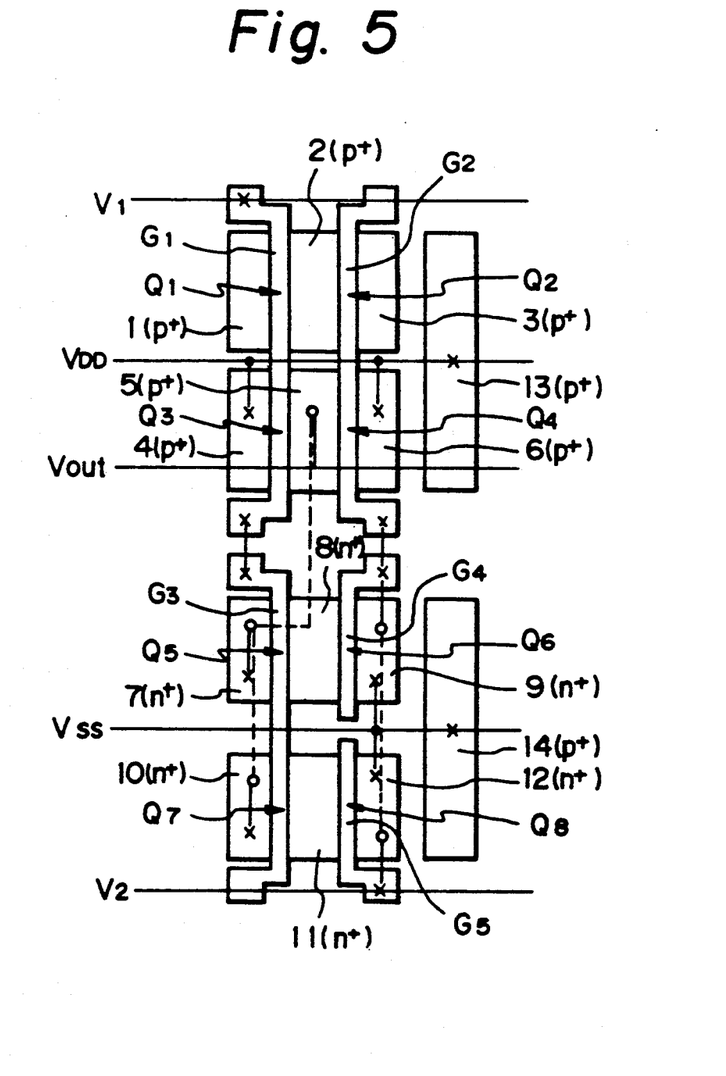
FIG. 5 is a plan view showing an embodiment in which the invention was applied to a 2-input NAND circuit.
Figure 6:
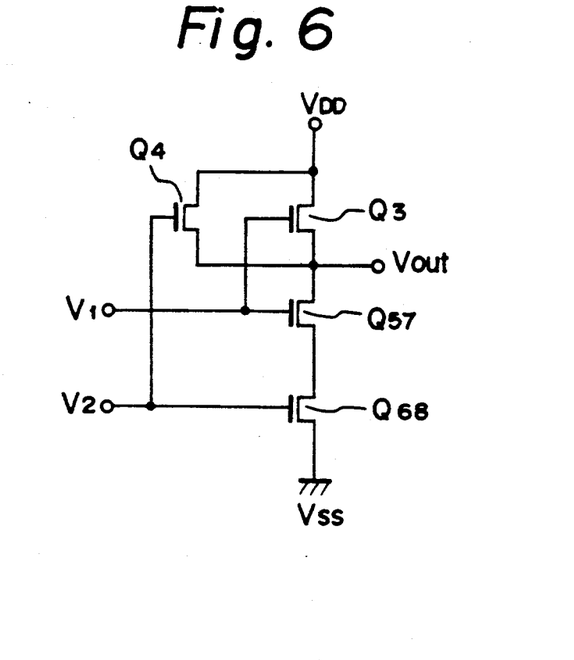
FIG. 6 is a circuit diagram showing an equivalent circuit of the 2-input NAND circuit shown in FIG. 5.

FIG. 5 shows an embodiment in which a 2-input NAND circuit is constructed by the sea of gates type CMOS gate array comprising the basic cell shown in FIG. 4. FIG. 6 shows an equivalent circuit of the 2-input NAND circuit shown in FIG. 5.

As shown in FIGS. 5 and 6, in the embodiment, the 2-input NAND circuit is constructed by the two p-channel MOS transistors $Q_3$ and $Q_4$ and the four n-channel MOS transistors $Q_5$ to $Q_8$ in the basic cell shown FIG. 4. The n-channel MOS transistors $Q_5$ and $Q_7$ are connected in parallel and the n-channel MOS transistors $Q_6$ and $Q_8$ are also similarly connected in parallel. In FIG. 6, $Q_{57}$ indicates the n-channel MOS transistors $Q_5$ and $Q_7$ which are connected in parallel and $Q_{63}$ indicates the n-channel MOS transistors $Q_6$ and $Q_8$ which are connected in parallel. In the embodiment, the transistors other than the p-channel MOS transistors $Q_3$ and $Q_4$ and the n-channel MOS transistors $Q_5$ and $Q_8$ mentioned above, that is, the p-channel MOS transistors $Q_1$ and $Q_2$ are not used.

In FIGS. 5 and 6, $V_1$ and $V_2$ denote input voltages to gates of the n-channel MOS transistors $Q_{57}$ and $Q_{57}$ and $V_{OUT}$ indicates an output voltage.

In the embodiment, the wiring is performed by the Al wirings of two layers. The wirings for $V_1$, $V_2$ and $V_{OUT}$ are constructed by the Al wiring of the first layer in a manner similar to the wirings to supply the power source voltages $V_{DD}$ and $V_{SS}$. In this case, the Al wirings of the first layer for $V_1$ and $V_2$ are come into contact with the gate electrodes $G_1$ and $G_5$, respectively. On the other hand, the Al wiring of the first layer for $V_{OUT}$ comes into contact with the semiconductor region 5 and is also come into contact with the semiconductor region 7 through the Al wirings of the first and second layers.

Figure 7:
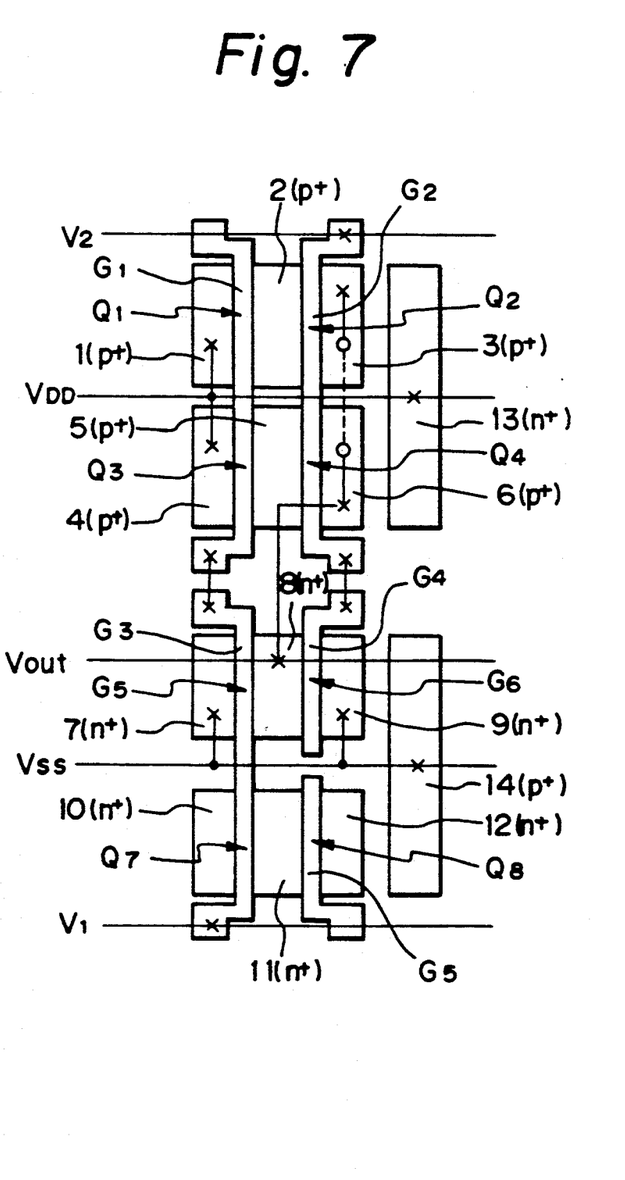
FIG. 7 is a plan view showing an embodiment in which the invention was applied to a 2-input NOR circuit.

According to the embodiment, since the 2-input NAND circuit has been constructed by the basic cell shown in FIG. 4, a degree of freedom of the wirings among the transistors is larger than that in the case of constructing the 2-input NAND circuit by using the conventional basic cell as shown in FIG. 7. Therefore, in the case of considering on the assumption that the integration densities are the same, the 2-input NAND circuit of the circuit construction which is closer to the optimum construction as compared with the conventional one can be easily realized. Further, since each of the n-channel MOS transistors $Q_{57}$ and $Q_{68}$ has a channel width which is twice as large as each channel width of the n-channel MOS transistors $Q_{57}$ to $Q_8$, its current driving capability is very large. Therefore, the 2-input NAND circuit of a high performance can be realized.

An embodiment in which the invention was applied to a 2-input NOR circuit will now be described.

Figure 8:
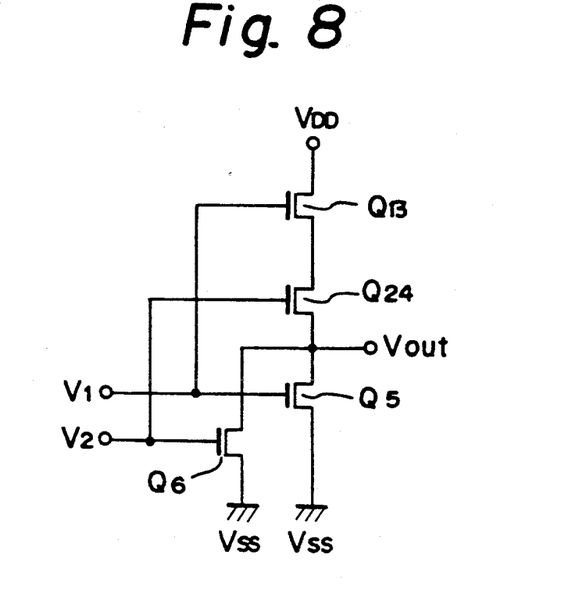
FIG. 8 is a circuit diagram showing an equivalent circuit of the 2-input NOR circuit shown in FIG. 7.

FIG. 7 shows an embodiment in which a 2-input NOR circuit is constructed by the sea of gate type CMOS gate array comprising the basic cell shown in FIG. 4. FIG. 8 shows an equivalent circuit of the 2-input NOR circuit shown in FIG. 7.

As shown in FIGS. 7 and 8, in the embodiment, the 2-input NOR circuit is constructed by the four p-channel MOS transistors $Q_1$ to $Q_4$ and the two n-channel MOS transistors $Q_5$ and $Q_6$ in the basic cell shown in FIG. 4. The p-channel MOS transistors $Q_1$ and $Q_3$ are connected in parallel and the p-channel MOS transistors $Q_2$ and $Q_4$ are also similarly connected in parallel. In FIG. 8, $Q_{13}$ denotes the p-channel MOS transistors $Q_1$ and $Q_3$ which are connected in parallel and $Q_{24}$ indicates the n-channel MOS transistors $Q_2$ and $Q_4$ which are connected in parallel. In the embodiment, the transistors other than the p-channel MOS transistors $Q_1$ to $Q_4$ and the n-channel MOS transistors $Q_5$ and $Q_6$, that is the n-channel MOS transistors $Q_7$ and $Q_8$ are not used.

In the embodiment, the wiring is performed by the Al wirings of two layers. The wirings for $V_1$, $V_2$ and $V_{OUT}$ are constructed by the Al wiring of the first layer in a manner similar to the wirings to supply the power source voltages $V_{DD}$ and $V_{SS}$. In this case, the Al wirings of the first layer for $V_1$ and $V_2$ are come into contact with the gate electrodes $G_3$ and $G_2$, respectively. On the other hand, the Al wiring of the first layer for $V_{OUT}$ is come into contact with the semiconductor regions 8 and 6 and is also come into contact with the semiconductor region 3 through the Al wirings of the second and first layers.

According to the embodiment, since the 2-input NOR circuit is constructed by the basic cell shown in FIG. 4, a degree of freedom of the wirings among the transistors is larger than that in the case of constructing the 2-input NOR circuit by using the conventional basic cell as shown in FIG. 1. Therefore, the 2-input NOR circuit of the circuit construction which is closer to the optimum construction as compared with the conventional one can be easily realized. Further, each of the p-channel MOS transistors $Q_{13}$ and $Q_{24}$ has a channel width which is twice as large as the channel width of each of the p-channel MOS transistors $Q_1$ to $Q_4$. Thus, its current driving capability is almost equal to that of the n-channel MOS transistors $Q_4$ to $Q_8$.

Therefore, the 2-input NOR circuit of a high performance can be realized.

Although the embodiments of the invention have practically been described above, the invention is not limited to the above embodiments but various modifications based on the technical idea of the invention are possible.

For instance, the dimensions A and B of the basic cell shown in FIG. 4 and the channel width W and channel length L of each of the p-channel MOS transistors $Q_1$ to $Q_4$ and n-channel MOS transistors $Q_5$ to $Q_8$ constructing the basic cell can be selected in accordance with the necessity. On the other hand, the gate electrodes $G_1$ to $G_5$ can be also set into shapes different from those in the embodiments. Further, a method of wiring among the p-channel MOS transistors $Q_1$ to $Q_4$ and n-channel MOS transistors $Q_5$ to $Q_8$ is not limited to the above embodiments.

On the other hand, the invention can be also applied to the case of constructing an inverter circuit, a transmission circuit, or the like.

According to the invention, in the case of constructing, for instance, a full CMOS type static RAM, a high integration density of the memory cells can be realized. In the case of constructing a NAND circuit, a NOR circuit, or the like, the circuit construction near the optimum construction can be realized.

What is claimed is:

1. A semiconductor device of a master slice type, comprising a basic cell comprising:
   first and second MOS transistors of a first conductivity type in each of which one of a source region and a drain region is commonly used;
   third and fourth MOS transistors of the first conductivity type in each of which one of a source region and a drain region is commonly used;
   fifth and sixth MOS transistors of a second conductivity type in each of which one of a source region and a drain region is commonly used; and
   seventh and eighth MOS transistors of the source region and a drain region is commonly used,
   gate electrodes of said first and third MOS transistors being commonly used, gate electrodes of said second and fourth MOS transistors being commonly used, and gate electrodes of said fifth and seventh MOS transistors being commonly used.

2. A semiconductor device according to claim 1, wherein gate electrodes of said sixth and eighth MOS transistors are separated from each other.

3. A semiconductor device according to claims 1 or 2, wherein said first to fourth MOS transistors are p-channel MOS transistors and said fifth to eighth MOS transistors are n-channel MOS transistors.

4. A semiconductor device according to claims 1 or 2, wherein channel-width-to-channel-length ratios of said fifth to eighth MOS transistors are equal.

5. A semiconductor device according to claims 1 or 2, wherein a memory cell of a full CMOS static RAM is constructed using one said basic cell.

6. A semiconductor device according to claims 1 or 2, wherein a NAND circuit is constructed using one said basic cell.

7. A semiconductor device according to claims 1 or 2, wherein a NOR circuit is constructed using one said basic cell.

* * * * *